United States Patent
Lee

(10) Patent No.: US 12,402,488 B2
(45) Date of Patent: Aug. 26, 2025

(54) FLEXIBLE DISPLAY DEVICE AND METHOD OF MANUFACTURING THE SAME

(71) Applicant: LG Display Co., Ltd., Seoul (KR)

(72) Inventor: KyoungMook Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/463,122

(22) Filed: Sep. 7, 2023

(65) Prior Publication Data

US 2023/0422561 A1 Dec. 28, 2023

Related U.S. Application Data

(63) Continuation of application No. 17/317,811, filed on May 11, 2021, now Pat. No. 11,785,808.

(30) Foreign Application Priority Data

Nov. 10, 2020 (KR) .......................... 10-2020-0149102

(51) Int. Cl.
*H01L 27/32* (2006.01)
*G09F 9/30* (2006.01)
(Continued)

(52) U.S. Cl.
CPC ........... *H10K 59/122* (2023.02); *G09F 9/301* (2013.01); *H10K 71/00* (2023.02); *H10K 59/1201* (2023.02); *H10K 2102/311* (2023.02)

(58) Field of Classification Search
CPC . H10K 59/122; H10K 71/00; H10K 2102/311
(Continued)

(56) References Cited

U.S. PATENT DOCUMENTS

2008/0218061 A1* 9/2008 Chao .................... H10K 59/122
438/129
2009/0039773 A1 2/2009 Jun et al.
(Continued)

FOREIGN PATENT DOCUMENTS

EP 3454374 A1 3/2019
KR 10-2016-0026364 A 3/2016
(Continued)

OTHER PUBLICATIONS

English Machine Translation of KR 2017/0128741. (Year: 2017).*
(Continued)

*Primary Examiner* — Dzung Tran
(74) *Attorney, Agent, or Firm* — Fenwick & West LLP

(57) ABSTRACT

The present disclosure relates to a flexible display device including: a substrate over which a thin film transistor is disposed, an intermediate layer disposed to cover the thin film transistor, a first electrode located on the intermediate layer and connected to the thin film transistor, a bank located on the intermediate layer and the first electrode and defining a first region exposing a part of the intermediate layer, a second region exposing a part of the first electrode, and a third region excluding the first and second regions, a first structure located in the first region defined by the bank and tapered toward the substrate, an organic light emitting layer located on the first electrode exposed in the second region, and a second electrode disposed on the organic light emitting layer. Both lateral surfaces of an inverse-tapered structure are disposed to contact the bank, and as a result, corresponding adhesion can be improved, and peeling defects can be reduced or corrected.

14 Claims, 13 Drawing Sheets

(51) Int. Cl.
  *H10K 59/122* (2023.01)
  *H10K 71/00* (2023.01)
  *H10K 59/12* (2023.01)
  *H10K 102/00* (2023.01)

(58) Field of Classification Search
  USPC .......................................................... 257/40
  See application file for complete search history.

(56) References Cited

U.S. PATENT DOCUMENTS

| | | | |
|---|---|---|---|
| 2012/0223342 | A1 | 9/2012 | Tanada et al. |
| 2012/0228603 | A1 | 9/2012 | Nakamura |
| 2012/0235558 | A1 | 9/2012 | Matsuda et al. |
| 2013/0248867 | A1 | 9/2013 | Kim et al. |
| 2014/0183479 | A1 | 7/2014 | Park et al. |
| 2015/0279915 | A1* | 10/2015 | Morita ................ H10K 50/844 |
| | | | 257/88 |
| 2016/0064461 | A1 | 3/2016 | Lee et al. |
| 2016/0372528 | A1* | 12/2016 | Kamura ............... H10K 50/865 |
| 2017/0025486 | A1* | 1/2017 | Kwon ............... H10K 50/8428 |
| 2019/0081117 | A1 | 3/2019 | Moon et al. |

FOREIGN PATENT DOCUMENTS

| | | |
|---|---|---|
| KR | 10-2017-0128741 A | 11/2017 |
| KR | 10-2019-0029178 A | 3/2019 |

OTHER PUBLICATIONS

Intellectual Property Office of the United Kingdom, Office Action, GB Patent Application No. 2108416.5, Nov. 3, 2021, eight pages.

United States Office Action, U.S. Appl. No. 17/317,811, Dec. 15, 2022, 11 pages.

United States Office Action, U.S. Appl. No. 17/317,811, Mar. 28, 2023, 11 pages.

Korean Intellectual Property Office, Office Action, Korean Patent Application No. 10-2020-0149102, Jul. 12, 2025, 15 pages.

* cited by examiner

FLEXIBLE DISPLAY DEVICE AND METHOD OF MANUFACTURING THE SAME

CROSS-REFERENCE TO RELATED APPLICATION

This application is a continuation application of U.S. patent application Ser. No. 17/317,811 filed on May 11, 2021, which claims priority from Korean Patent Application No. 10-2020-0149102, filed on Nov. 10, 2020 in the Korean Intellectual Property Office, the disclosures of all of which are incorporated herein by reference in their entirety.

BACKGROUND

Field of the Disclosure

The present disclosure relates to flexible display devices and method of manufacturing the same, and more specifically, to a flexible display device for minimizing a peeling defect of an organic light emitting layer by including a structure with an inverse taper shape and method of manufacturing the same.

Description of the Background

Image display devices configured to display various information or data on a display screen act as a core device in the information and communication era. The display devices become thinner and lighter and are being developed to have high performance while being portable. Among various types of display devices, there are growing needs for display devices that can be manufactured to have a relatively light weight and a relatively thin package. Display devices having a self-emissive property are advantageous in terms of less power consumption as low-voltage driving is available, and have a short response time, high luminous efficiency, a wide viewing angle, and a high contrast ratio. Thus, these display devices have been developed as next generation displays. These display devices can display images by stimulating a plurality of subpixels arranged in a matrix form. Each of the plurality of subpixels includes a light emitting element and a plurality of transistors that independently drive the light emitting element.

A liquid crystal display (LCD) device, a quantum dot (QD) display device, a field emission display (FED) device, an organic light emitting diode (OLED) display device, and the like are examples of such display devices. Among these display devices, the organic light emitting display device has become attractive for displaying more vibrant colors and implementing a more compact package without a need for a separate light source, and has advantages of a short response time, a high contrast ratio, high luminous efficiency, high luminance, a wide viewing angle, and the like by using a self-emissive organic light emitting diode (OLED).

Recently, a flexible display device capable of displaying images even when the display device is bent like paper, by disposing a display portion and lines on a flexible substrate such as plastic substrate, has attracted attention as a next generation display device.

As the application range of the flexible display device becomes wider from computer monitors and TVs to portable electronic devices with displays, such as cellular telephones, tablet computers, laptop computers, and the like, research and development are in progress on flexible display devices with reduced volume and weight while having a wide display area.

In particular, as described above, the organic light emitting diode (OLED) display device does not require a separate light source; therefore, this type of display device can be implemented to have a relatively thin package. As a result, there have been increasingly attempts to develop the organic light emitting display device as a flexible display device.

In a situation where a flexible organic light emitting display device is folded, tensile stress and compressive stress may be applied to the flexible organic light emitting display device due to the folding.

The continuous application of the tensile stress and the compressive stress due to repeated folding may cause a peeling defect in which multiple layers included in the organic light emitting display device are separated from one another, and this may negatively affect the reliability of the flexible organic light emitting display device.

In particular, an organic light emitting layer among multiple layers included in the organic light emitting display device is the most vulnerable part due to the difficulty of implementing the patterning for relieving folding stress, and relatively weak adhesion.

To solve such a peeling problem in an organic light emitting layer of the flexible organic light emitting display device, various attempts have been made, such as the deposition of a spacer on a bank layer.

SUMMARY

To address the above issues, embodiments described herein relate to flexible display devices and manufacturing methods thereof for solving peeling defects in an organic light emitting layer.

In accordance with one aspect of the present disclosure, a flexible display device is provided that includes a substrate over which a thin film transistor is disposed, an intermediate layer disposed to cover the thin film transistor, a first electrode located on the intermediate layer and connected to the thin film transistor, a bank located on the intermediate layer and the first electrode and defining a first region exposing a part of the intermediate layer, a second region exposing a part of the first electrode, and a third region excluding the first and second regions, a first structure located in the first region defined by the bank and tapered toward the substrate, an organic light emitting layer located on the first electrode exposed in the second region, and a second electrode disposed on the organic light emitting layer.

In accordance with another aspect of the present disclosure, a method of manufacturing the flexible display device is provided that includes a step of disposing an intermediate layer to cover a thin film transistor over a substrate over which the thin film transistor is disposed, a step of disposing a first electrode electrically connected to the thin film transistor on the intermediate layer, a step of disposing on the intermediate layer a first structure to be spaced apart from the first electrode and tapered to the substrate, a step of disposing a bank on the intermediate layer and the first electrode, a step of disposing an organic light emitting layer on the first electrode, and a step of disposing a second electrode to overlap with all or at least a part of the substrate on the organic light emitting layer.

In accordance with the aspects above described, other aspects, embodiments and examples of the present disclosure and resulted advantages will be described below, and variations thereof will become apparent to those skilled in the art from the following detailed description.

In accordance with aspects of the present disclosure, as an inverse-tapered structure for preventing a lateral current leakage between adjacent pixels or subpixels through an organic light emitting layer can be located to be adjacent to a tapered structure; indeed, it is possible to improve degree of freedom in designing a corresponding flexible display device, and an advantage of implementing a thin flexible display device is provided because there is no increase in thickness that would be caused by the formation of a structure with an inverse-taper shape.

Further, as both lateral surfaces of the inverse-tapered structure are disposed to contact a bank, corresponding adhesion can be improved, and peeling defects can be reduced or corrected.

Effects according to aspects of the present disclosure are not limited to the above description, more various effects will be apparent in following description.

DETAILED DESCRIPTION

Figure 1A:
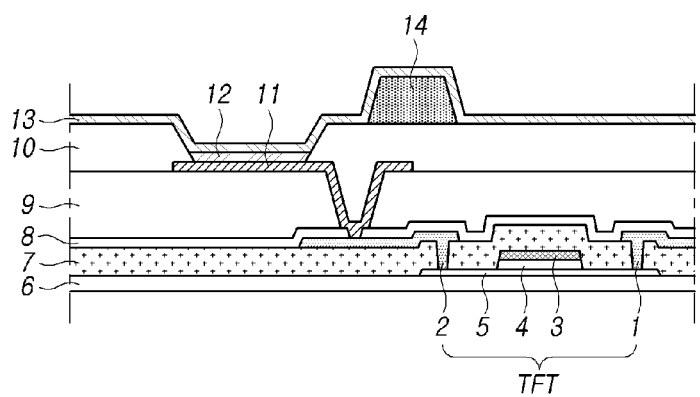
FIG. 1A is a cross-sectional view of a flexible display device including a spacer with a typical taper shape.

The advantages and features of the present disclosure and methods of achieving the same will be apparent by referring to embodiments of the present disclosure as described below in detail with reference to the accompanying drawings. It should be noted that the present disclosure is not limited to embodiments set forth below and may be implemented in various different forms. Thus, embodiments of the present disclosure are provided for specifically describing the present disclosure and for specifically informing those skilled in the art to which it pertains of the scope of the present disclosure, and the scope of the present invention is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear.

The terms, such as "including," "having," "containing," "comprising of," "consist of," or the like, used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as 'directly', "only" are used.

Time relative terms, such as "after", "subsequent to", "next," "before" or the like, used herein to describe a temporal relationship between events, operations, or the like are generally intended to include events, cases, operations, or the like that do not occur consecutively unless the terms, such as 'directly'" "immediately," or the like, are used.

When the terms, such as "first," "second," or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

It should be understood that the term "at least one" used herein may include all combinations obtained by combining one or more associated elements. For example, "at least one of a first item, a second item and a third item" may include all combinations obtained by two or more of the first item, the second item and the third item, as well as each of the first item, the second item and the third item.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Hereinafter, examples of display devices in accordance with embodiments of the present disclosure will be discussed in detail with reference to accompanying drawings. In denoting elements of the drawings by reference numerals, the same elements will be referenced by the same reference numerals although the elements are illustrated in different drawings. Scale of the components shown in the accompanying drawings is illustrated for convenience of description and may be different from actual scale; thus, embodiments of the present disclosure are not limited to the scale shown in the drawings.

Figure 1B:
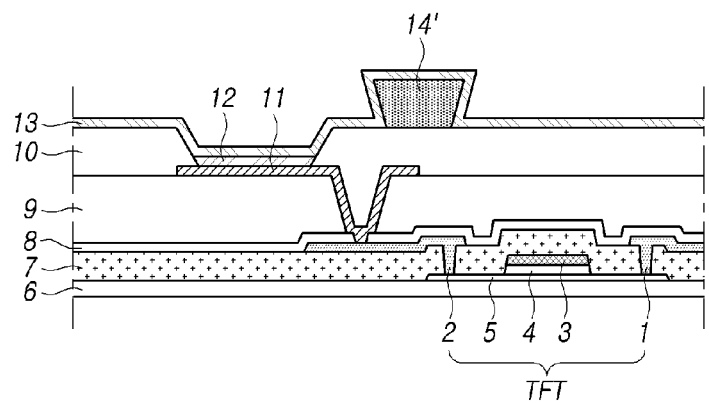
FIG. 1B is a cross-sectional view of a flexible display device including a spacer with an inverse taper shape.

FIG. 1A is a cross-sectional view of a flexible display device including a spacer with a typical taper shape, and FIG. 1B is a cross-sectional view of a flexible display device including a spacer with an inverse taper shape.

Referring to FIGS. 1A and 1B, a semiconductor layer 5 is located on a substrate 6, and a gate insulating film 4 is located on the semiconductor layer 5. A gate electrode 3 is located to face the semiconductor layer 5 on the gate insulating film 4. That is, the gate insulating film 4 is interposed between the gate electrode 3 and the semiconductor layer 5. An insulating layer 7 is located on the gate electrode 3, and a source electrode 1 and a drain electrode 2 are disposed on the insulating layer 7. Each of the source electrode 1 and the drain electrode 2 is connected to the semiconductor layer 5 through an access hole formed in the insulating layer 7. Accordingly, a thin film transistor including the semiconductor layer 5, the gate electrode 3, the source and drain electrodes 1 and 2 are disposed on the substrate 6. A protective layer 8 and a planarization layer 9 are disposed on the source and drain electrodes 1 and 2, and a reflective electrode 11 is located on the planarization layer 9. An organic light emitting layer 12 and a common electrode 13 are located on the reflective electrode 11.

Considering characteristics of a flexible display device required to be used in an flexible environment, a spacer 14 may be disposed on a bank layer 10 located on the planarization layer 9 and the reflective electrode 11 to relieve bending stress put on various layers, such as the organic light emitting layer 12, and the like.

Although the spacer 14 may relieve stress put on the flexible display device when bending is performed, as the lower surface of the spacer 14 has an area greater than the upper surface thereof, therefore, corresponding tensile stress may not be greatly reduced. Indeed, there has been a problem that the prevention of peeling defects caused in the organic light emitting layer 12 has little or no effect.

In this case, the spacer may be implemented to have an inverse taper shape to relieve tensile stress, as well as compressive stress.

As shown in FIG. 1B, when bending stress is put, a spacer 14' with such an inverse taper shape disposed on the bank layer 10 can lead to the stress being distributed; therefore, the peeling of the organic light emitting layer can be prevented, and reliability of the device can be improved.

However, in a situation where the spacer 14' with the inverse taper shape is placed, when a metal mask deposition is performed, there is a problem that particles are generated between processes due to a contact between the mask and the spacer. Such particles can cause adhesion contamination in subsequent processes, and result in the yield of the device being lowered; therefore, it is highly desirable that the generation of the particles should be prevented or reduced.

To address such issue, according to aspects of the present disclosure, a flexible display device is provided in which by including a spacer with an inverse taper shape, the peeling of an organic light emitting layer can be prevented, and the particle problem that can be occurred due to the spacer with the inverse taper shape can be reduced or solved.

Figure 2:
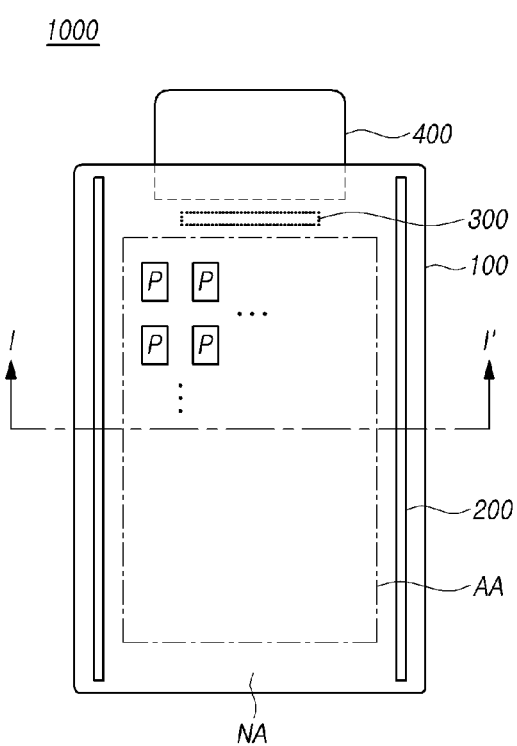
FIG. 2 is a plan view illustrating a flexible display device according to aspects of the present disclosure.

Hereinafter, a flexible display device according to aspects of the present disclosure will be discussed with reference to FIG. 2. FIG. 2 is a plan view illustrating the flexible display device according to aspects of the present disclosure.

Referring to FIG. 2, the flexible display device according to aspects of the present disclosure can include a display panel 100, a gate driver 200, a data driver 300, and a circuit board 400.

Figure 3:
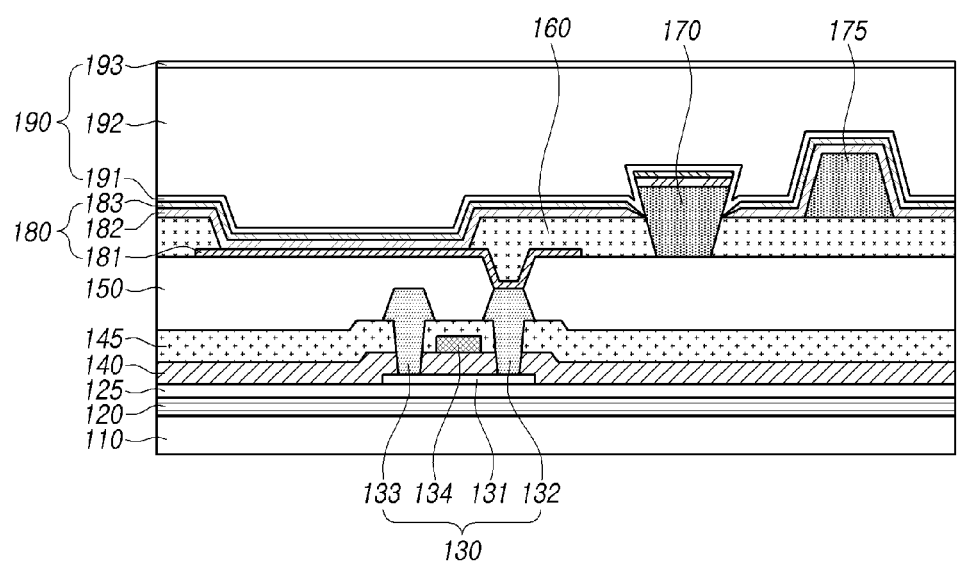
FIG. 3 is a cross-sectional view illustrating a flexible display device according to aspects of the present disclosure.

The display panel 100 includes a substrate 110 (shown in FIG. 3), and the substrate 110 supports elements included in an organic light emitting element 180 (shown in FIG. 3). The substrate 110 may be formed of a material selected from groups including polyester-based polymers, silicone-based polymers, acrylic-based polymers, polyolefin-based polymers, and combinations of two or more thereof, which are materials having flexibility in bending. However, embodiments of the present disclosure are not limited thereto. For example, glass formed in an ultra-thin shape may be used to implement a flexible display device.

The organic light emitting element 180 is disposed over the substrate 110, and can emit light toward the outside of the display panel 100. The organic light emitting element 180 can include a hole injecting layer, a hole transport layer, an organic light emitting layer, an electron transport layer and an electron injecting layer.

The substrate 110 may have, in plan view, a rectangular shape in which each corner portion is rounded with a constant radius of curvature, or a non-rectangular shape having at least six sides. The substrate 110 with the non-rectangular shape may include at least one protrusion or at least one notch.

The substrate 110 may be divided into an active area AA (or a display area) and a non-active area NA (or a non-display area). The active area AA may be located in a center area of the substrate 110, and be defined as an area for displaying images.

The active area AA may have, in plan view, a rectangular shape in which each corner portion is rounded with a constant radius of curvature, or a non-rectangular shape having at least six sides. The active area AA with the non-rectangular shape may include at least one protrusion or at least one notch.

The non-active area NA may be located in an edge area of the substrate 110 to surround the active area AA, and be defined as an area in which images are not displayed or an edge area.

A pixel P may be disposed in the active area AA of the substrate 110. In one embodiment, a plurality of pixels P may be arranged in a matrix form, and located in the active area AA of the substrate 110.

The data driver 300 may be mounted in a chip mount area defined in the non-active area NA of the substrate 110 through a chip mounting (or bonding) process. The data driver 300 can receive several levels or types of power, a timing synchronization signal, digital image data, and the like, which are input from the circuit board 400, control the driving of the gate driver 200 by generating a gate control signal according to the timing synchronization signal, convert the digital image data to pixel data voltages in analogue, and provide the resulted pixel data voltages to one or more pixels P.

Although not shown in FIG. 2, one or more dams may be located between the active area AA and the gate driver 200. In another embodiment, the dam may be located in an edge farther away from the gate driver 200, for example, an outermost edge.

The display panel 100 can be bent or folded along a reference line I-I' running parallel to the data driver 300. However, a direction or location of the reference line I-I' is not limited thereto. For example, when needed, the display panel 100 may be bent or folded in various directions or locations.

Hereinafter, further referring to FIGS. 3 to 5, embodiments of the present disclosure will be discussed in detail.

FIG. 3 is a cross-sectional view illustrating a flexible display device according to aspects of the present disclosure.

Referring to FIG. 3, a front-emission flexible display device according to aspects of the present disclosure includes a substrate 110, a thin film transistor 130 such as a driving thin film transistor, an organic light emitting element 180, and at least one structure (170, 175).

The driving thin film transistor 130 includes a semiconductor layer 131, a gate electrode 134, a source electrode 133, and a drain electrode 132.

The semiconductor layer 131 is disposed over the substrate 110. The semiconductor layer 131 may be implemented with an amorphous silicon film or a polycrystalline silicon film obtained by crystallizing amorphous silicon. One or more buffer layers 120 and 125 may be interposed between the substrate 110 and the semiconductor layer 131.

The buffer layers 120 and 125 may be formed to protect the thin film transistor from impurities such as alkali ions flowing out of the substrate 110 when the semiconductor layer 131 is crystallized.

The gate electrode 134 is disposed on a first insulating layer 140 and overlaps with the semiconductor layer 131. In this instance, the gate electrode 134 is connected to a gate line delivering a gate signal. The gate electrode 134 may be made up of a single layer or multiple layers formed of one or more of molybdenum (Mo), aluminum (Al), chromium (Cr), gold (Au), titanium (Ti), nickel (Ni), neodymium (Nd), and copper (Cu), or an alloy or alloys of two or more thereof.

The source electrode 133 and the drain electrode 132 are disposed to be spaced apart by a predetermined gap, and electrically connected to the semiconductor layer 131. More specifically, a semiconductor-layer-contact hole exposing the semiconductor layer 131 is formed in the first and second insulating layers 140 and 145, and the source and drain electrodes 133 and 132 are connected to the semiconductor layer 131 through the semiconductor-layer-contact hole.

An intermediate layer 150 is disposed on the driving thin film transistor 130. A drain-contact hole exposing the drain electrode 132 of the driving thin film transistor 130 is formed in the intermediate layer 150

Next, the organic light emitting element 180 includes a first electrode 181, an organic light emitting layer 182, and a second electrode 183. The organic light emitting element 180 is electrically connected to the driving thin film transistor 130. More specifically, the organic light emitting element 180 is connected to the drain electrode 132 of the driving thin film transistor 130 through the drain-contact hole.

The first electrode 181 is disposed on the intermediate layer 150, and connected to the drain electrode 132 of the driving thin film transistor 130 through the drain-contact hole. The first electrode 181 serves to apply a current (or a voltage) to the organic light emitting layer 182, and defines a light emitting region with a predetermined size.

The first electrode 181 acts as an anode. To do this, the first electrode 181 may be formed of a transparent conductive material with a relatively large work function. In one embodiment, the transparent conductive material may include Indium Tin Oxide (ITO) or Indium Zinc Oxide (IZO). To improve reflection efficiency, the first electrode 181 may further include a reflective film (not shown) formed of a metal material having high reflection efficiency in a lower portion of the first electrode. In one embodiment, the metal material may include one or more of silver (Ag), aluminum (Al), and an alloy thereof.

A bank 160 including a first opening exposing a part of the first electrode 181 is disposed on the first electrode 181. The bank 160 may further include a second opening exposing a part of the intermediate layer 150. Discussions on this will be given below.

The organic light emitting layer 182 is interposed between the first and second electrodes 181 and 183. The organic light emitting layer 182 can emit light by the combination of holes provided from the first electrode 181 and electrons provided from the second electrode 183.

In one embodiment, FIG. 3 illustrates that the organic light emitting layer 182 is disposed to overlap with all or at least a part of the substrate. In another embodiment, the organic light emitting layer 182 may be disposed only on the first electrode 181.

The organic light emitting layer 182 can include a hole injecting layer, a hole transport layer, a light emitting layer, an electron transport layer and an electron injecting layer.

The hole injecting layer (not shown) is disposed on the first electrode 181, and serves to move holes. The hole transport layer (not shown) is disposed on the hole injecting layer, and serves to transport holes injected from the hole injecting layer to the light emitting layer.

The light emitting layer is interposed between the hole transport layer and the electron transport layer, and can emit white light by the combination of holes provided from the first electrode 181 and electrons provided from the second electrode 183.

The electron transport layer (not shown) is disposed on the light emitting layer, and transports electrons injected from the electron injecting layer to the light emitting layer. The electron injecting layer (not shown) is disposed on the electron transport layer. Such an electron injecting layer may be omitted.

In addition, the light emitting layer may include first and second light emitting stacks facing each other, and an electric charge generation layer is interposed between the first and second light emitting stacks. In this instance, as any one of the first and second light emitting stacks generates blue light, and the other of the first and second light emitting stacks generates yellow-green light, the white light can be generated through the first and second light emitting stacks. The white light generated in such light emitting stacks may enter a color filter located in an upper or lower portion of the light emitting layer; thereby, color images may be implemented.

In another embodiment, without a separate color filter, color images may be implemented by generating colored light corresponding to respective subpixels of light emitting layers. For example, a light emitting layer of a red (R) subpixel, a light emitting layer of a green (G) subpixel, and a light emitting layer of a blue (B) subpixel may generate red light, green light, and blue light, respectively.

The second electrode 183 is disposed on the organic light emitting layer 182, and provides electrons to the organic light emitting layer 182. The second electrode 183 acts as a cathode. To do this, the second electrode 183 may be formed of a transparent conductive material. In one embodiment, the transparent conductive material may include Indium Tin Oxide (ITO) or Indium Zinc Oxide (IZO). The second electrode 183 may further include a thin metal film (not shown) formed of a metal material with a low work function in a portion contacting the organic light emitting layer 182. For example, the metal material may include magnesium (Mg), silver (Ag), and compounds thereof.

The bank 160 may be located on the first electrode 181 of the organic light emitting element 180 and the intermediate layer 150. The bank 160 serves to separate pixels P located to be adjacent to one another in the active area AA, and can define multiple pixels P. The bank 160 may be formed of an organic material.

The bank 160 may define a first region exposing a part of the intermediate layer 150, a second region exposing a part of the first electrode 181, and a third region except for the first and second regions. The second region defined by the bank 160 may be equal to the light emitting region defined by the first electrode 181.

At least one structure (170, 175) disposed in the display device may include a first structure 170 with an inverse taper shape (i.e. a cross-sectional area of the first structure 170 becomes smaller toward the substrate (i.e. from the top to the bottom)), and a second structure 175 with a taper shape (i.e. a cross-sectional area of the second structure 175 becomes larger toward the substrate). In this instance, the first structure 170 may be disposed on the intermediate layer 150, and the second structure 175 may be disposed on the bank 160.

The first structure 170 may be located in the first region defined by the bank 160, and the second structure 175 may be located on the third region defined by the bank 160.

The organic light emitting layer 182 provides an access hole exposing the bank 160 in the vicinity of the first region defined by the bank 160. The organic light emitting layer 182 is disposed on an upper portion, such as a top surface, of the first structure 170 by shading effect, and is not disposed in a portion lower than the upper portion of the first structure 170. Thus, an access hole is formed in the organic light emitting layer 182.

In this instance, both lateral surfaces of the first structure 170 are disposed to contact the bank 160; therefore, adhesion can be improved, and peeling defects can be reduced or corrected. Further, an angle between at least one of lateral surfaces of the first structure 170 and the intermediate layer 150 may range from 20 degrees to 80 degrees.

The second structure 175 is disposed to be adjacent to the first structure 170 and to be spaced apart by a predetermined distance. As such a separation distance between the first and second structures 170 and 175 is smaller, degree of freedom in designing can be increased. In one embodiment, a distance between an end portion of an upper portion of the first structure 170 and an end portion of a lower portion of the second structure 175 may be 5 µm or less.

A thickness of the first structure 170 may be greater than that of the bank 160. The first structure 170 may be formed to have a thickness greater than the bank 160 to provide the shading effect for the organic light emitting layer 182. In one embodiment, the thickness of the first structure 170 may be greater by 0.5 µm or more than that of the bank 160.

A thickness of the second structure 175 may be greater than or equal to that of the bank 160. In one embodiment, the thickness of the second structure 175 may be 3 µm or less.

The organic light emitting layer 182 and the second electrode 183 are sequentially disposed on the first and second structures 170 and 175.

An encapsulation layer 190 can prevent the penetration of oxygen or moisture from the outside in order to prevent a light emitting material and an electrode material from being oxidized. When the organic light emitting element is exposed to moisture or oxygen, a pixel shrinkage phenomenon in which a light emitting region is reduced may be represented, or a dark spot may be generated in the light emitting region. The encapsulation layer 190 may be an inorganic film formed of glass, metal, aluminum oxide (AlOx), or a silicon (Si)-based material, or have a structure in which an organic film and an inorganic film are alternately stacked. The inorganic film serves to prevent the penetration of oxygen and moisture, and the organic film serves to enable the surface of the inorganic film to have a uniform height. When the encapsulation layer 190 is made up of multiple thin film layers, it is possible to enable traveling paths of moisture or oxygen to be elongated and complicated, and such elongated and complicated traveling paths lead the moisture or oxygen not to penetrate to the organic light emitting element.

The encapsulation layer 190 included in the display device according to aspects of the present disclosure may include a first encapsulation layer 191, a second encapsulation layer 192, and a third encapsulation layer 193. The first encapsulation layer 191 of the encapsulation layer 190 may be disposed on the second electrode 183. The second encapsulation layer 192 may be disposed on the first encapsulation layer 191. The third encapsulation layer 193 may be disposed on the second encapsulation layer 192. The first and third encapsulation layers 191 and 193 of the encapsulation layer 190 may be formed of silicon nitride (SiNx), silicon oxide (SiOx), silicon oxynitride (SiON), aluminum oxide (Al2O3), or the like. The second encapsulation layer 192 of the encapsulation layer 190 may be formed of an organic material, such as acryl resin, epoxy resin, phenolic resin, polyamide resin, polyimide resin, and the like; however, embodiments of the present disclosure are not limited thereto.

Figure 4A:
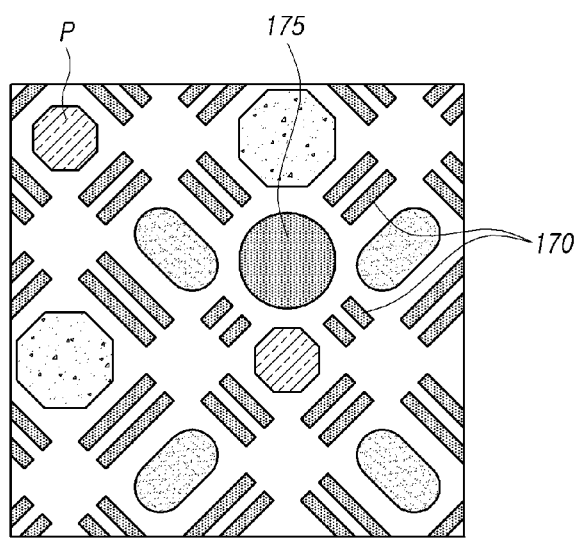
FIG. 4A is a plan view illustrating a pixel included in a typical flexible display device.
Figure 4B:
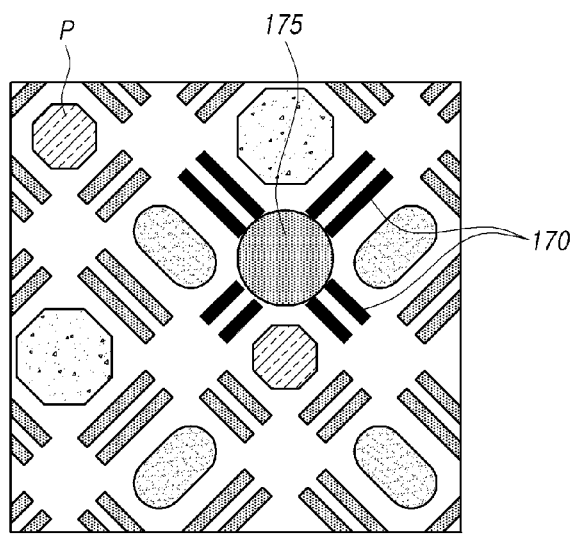
FIG. 4B is an enlarged plan view of a part of a flexible display device according to aspects of the present disclosure.

FIG. 4A is a plan view illustrating a pixel included in a typical flexible display device, and FIG. 4B is an enlarged plan view of a part of a flexible display device according to aspects of the present disclosure.

Referring to FIGS. 4A and 4B, first and second structures 170 and 175 are disposed between a plurality of pixels P.

In a flexible display device according to aspects of the present disclosure, the first structure 170 is disposed to be adjacent to the second structure 175. Accordingly, as a separation distance between the first and second structures 170 and 175 becomes smaller, it is therefore possible to improve degree of freedom in designing the flexible display device.

FIGS. 5A to 5G are cross-sectional views illustrating a manufacturing process of a flexible display device according to aspects of the present disclosure.

Each of FIGS. 5A to 5G is a cross-sectional view illustrating a process of manufacturing one pixel shown in FIGS. 3 and 4. Thus, like elements are labeled with like reference numbers, the details of which are not repeated herein for convenience of description.

Figure 5A:
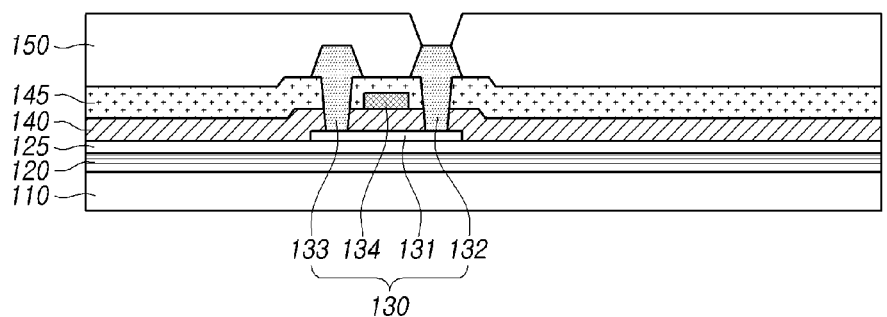
FIGS. 5A to 5G are cross-sectional views illustrating a manufacturing process of a flexible display device according to aspects of the present disclosure.

Referring to FIG. 5A, the semiconductor layer 131, the first insulating layer 140, the gate electrode 134, the second insulating layer 145, the source electrode 133, the drain electrode 132, and the intermediate layer 150 are sequentially disposed on the substrate 110.

The semiconductor layer 131 and the gate electrode 134 can be patterned through a so-called photolithography process, that is, by depositing a predetermined metal material on the substrate 110, applying a photoresist thereon and then exposing and developing the photoresist to form a mask pattern, etching a predetermined area of the metal material using the mask pattern, and removing the mask pattern.

It should be noted that the patterning of the semiconductor layer 131 and the gate electrode 134 is not necessarily limited thereto. For example, the semiconductor layer 131 and the gate electrode 134 may be directly patterned on a metallic paste through a printing process, such as screen printing, inkjet printing, gravure printing, gravure offset printing, reverse offset printing, flexo printing or microcontact printing.

A process of patterning each element described below may also be performed using the photolithography process or the printing process depending on included materials; thus, corresponding discussions are not repeatedly given for convenience of description. A semiconductor-layer-contact hole is formed in the first and second insulating layers 140 and 145. Such a semiconductor-layer-contact hole is formed by etching the first and second insulating layers 140 and 145 to expose a part of the semiconductor layer 131.

The source and drain electrodes 133 and 132 are patterned to be connected to the semiconductor layer 131 through the semiconductor-layer-contact hole, and be spaced apart from the gate electrode 134.

A drain-contact hole is formed in the intermediate layer 150. Such a drain-contact hole is formed by etching the intermediate layer 150 to expose a part of the drain electrode 132.

Figure 5B:
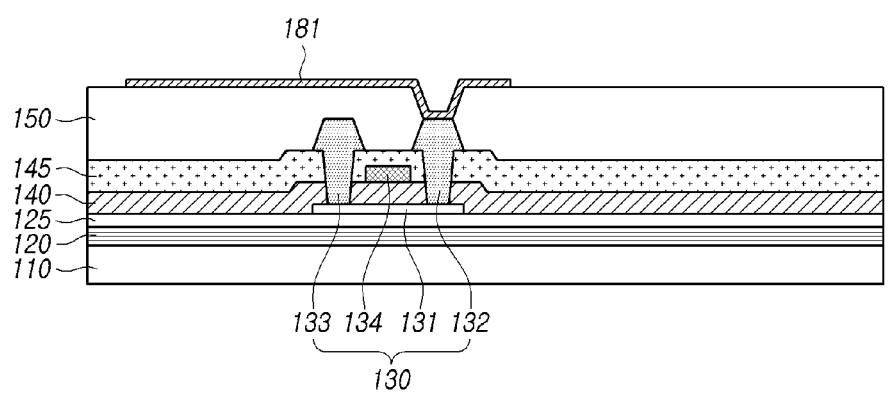

Referring to FIG. 5B, the first electrode 181 is formed over the substrate 110 over which the intermediate layer 150 is formed.

The first electrode 181 is patterned to be connected to the drain electrode 132 through the drain-contact hole.

Figure 5C:
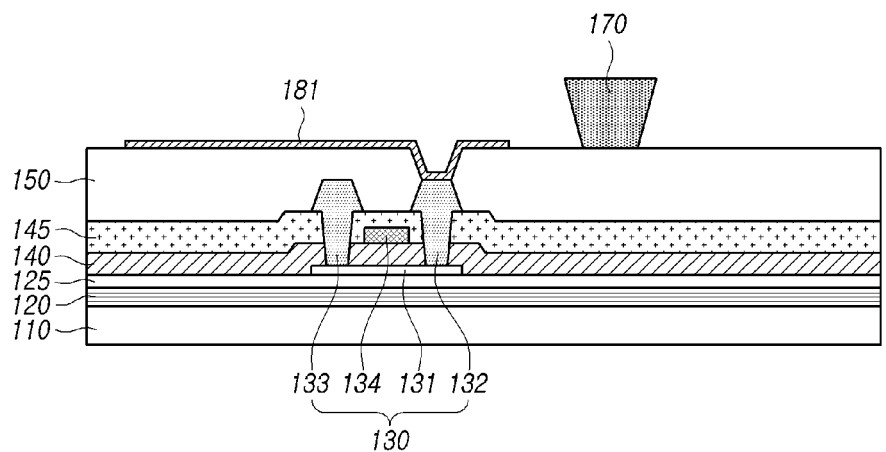

Referring to FIG. 5C, the first structure 170 is formed on the intermediate layer 150.

In this instance, the first structure 170 has an inverse taper shape, i.e. a cross-sectional area of which becomes smaller toward the substrate (from the top to the bottom). A location in which the first structure 170 is formed may correspond to the first region defined by the bank 160.

Figure 5D:
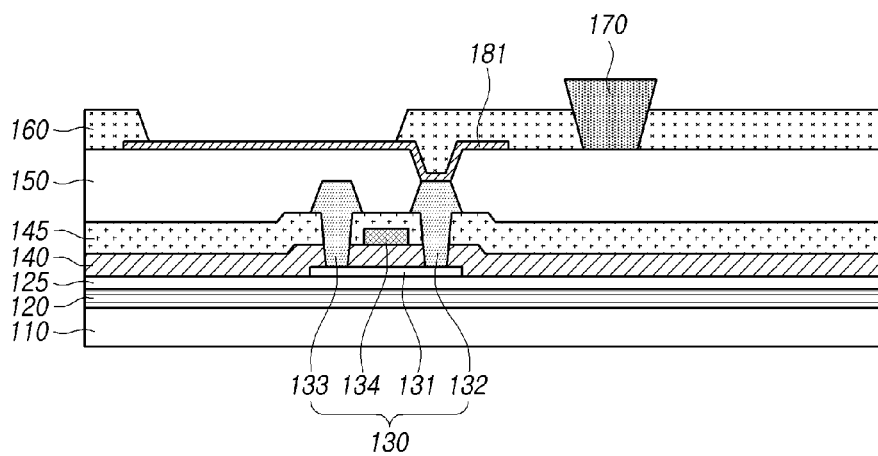

Next, referring to FIG. 5D, the bank 160 having an opening in the first region is formed on the first electrode 181 and the intermediate layer 150.

The bank 160 is formed to have an opening in the second region by depositing a predetermined material over a surface of the substrate 110 and removing a predetermined area of the deposited material through an etching process. As a result, the first electrode 181 may be exposed in the second region. Further, as the first structure 170 is formed prior to the bank 160, the bank 160 may be formed to contact the first structure 170 in the first region.

Figure 5E:
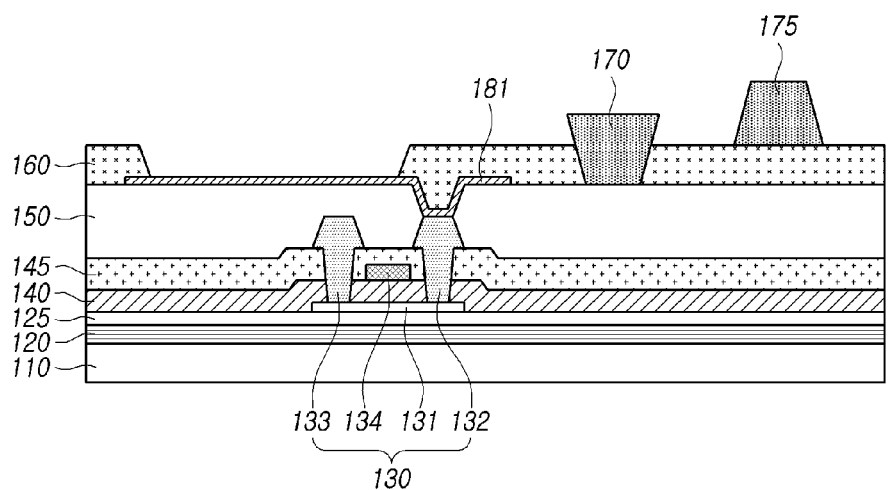

Referring to FIG. 5E, the second structure 175 is formed in the third region defined by the bank 160.

The first and second structures 170 and 175 are spaced apart from each other, and a distance between an end portion of an upper portion of the first structure 170 and an end portion of a lower portion of the second structure 175 may be 5 μm or less.

Figure 5F:
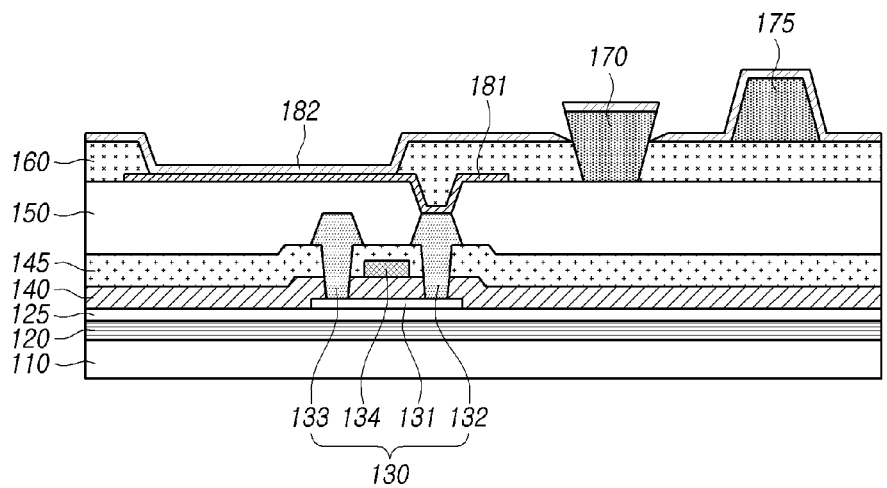

Referring to FIG. 5F, the organic light emitting layer 182 is formed over the surface of the substrate 110. For example, the organic light emitting layer 182 is formed to overlap with all or at least a part of the substrate 110 in a plan view.

The organic light emitting layer 182 is formed using thermal vacuum evaporation. The thermal vacuum evaporation causes an organic material to enter in a direction perpendicular to the substrate 110.

The organic light emitting layer 182 is formed to be electrically connected to the first electrode 181 in the second region defined by the bank 160. Further, the organic light emitting layer 182 is formed to have an access hole exposing a part of the bank 160 in the vicinity of the first region. The access hole is formed by the first structure 170 formed in the first region.

Figure 5G:
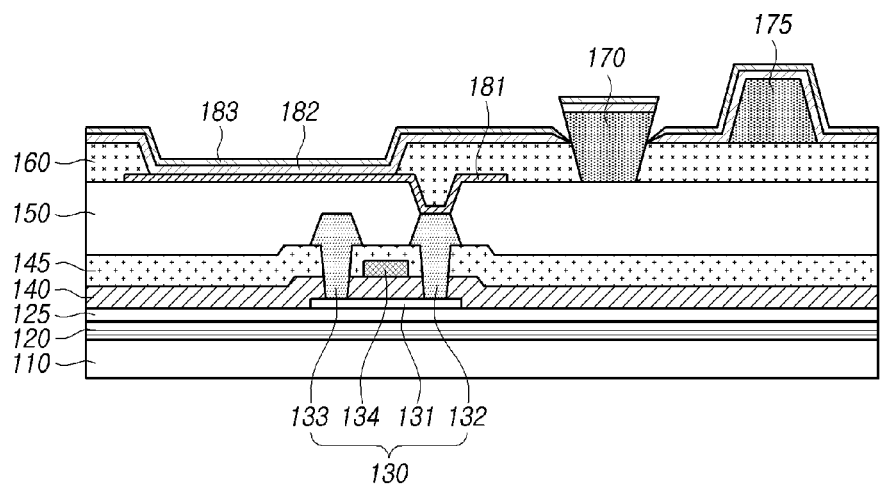

Referring to FIG. 5G, the second electrode 183 is formed over all or at least a part of the surface of the substrate 110.

The second electrode 183 is formed by the thermal vacuum evaporation of a predetermined metal material. In this instance, the predetermined metal material is entered in a direction perpendicular to the substrate 110, and deposited on the organic light emitting layer 182.

The organic light emitting layer 182 is disposed on an upper portion, such as a top surface, of the first structure 170 by the shading effect, and is not formed in a portion lower than the upper portion of the first structure 170.

Thus, by forming the first structure 170 in an opening of the bank 160, even when a structure with an inverse taper shape is formed, a display panel 100 can have a thickness equal to that in a display panel in which the structure having the inverse taper shape is not formed. When an inverse-tapered structure is formed, a flexible display device can be generally formed to have a small thickness considering that a height of a taper is larger than 3 μm, and thus, there is provided an advantage of implementing a thin flexible display device. Further, as the structure having the inverse taper shape is located lower than the structure having the taper shape, when the metal mask deposition is performed, it can be prevented that particles are generated due to a contact between the mask and the structure having the inverse taper shape. Thus, even when the structure having the inverse taper shape is included in the flexible display device, the particle problem capable of occurring in a deposition process can be reduced or solved.

Further, as an inverse-tapered structure for preventing a lateral leakage current between adjacent pixels P through the organic light emitting layer 182 is located to be adjacent to a tapered structure, it is possible to produce an effect of improving degree of freedom in designing the display device.

Flexible display devices according to embodiments herein can be described as follows.

A flexible display device according to embodiments herein can include a substrate over which a thin film transistor is disposed, an intermediate layer disposed to cover the thin film transistor, a first electrode located on the intermediate layer and connected to the thin film transistor, a bank located on the intermediate layer and the first electrode and defining a first region exposing a part of the intermediate layer, a second region exposing a part of the first electrode, and a third region except for the first and second regions, a first structure located in the first region defined by the bank and tapered toward the substrate, an organic light emitting layer located on the first electrode exposed in the second region, and a second electrode disposed on the organic light emitting layer.

In the flexible display device according to embodiments herein, the first structure is disposed to contact the intermediate layer, and both lateral surfaces of the first structure may contact the bank.

In the flexible display device according to embodiments herein, a thickness of the first structure may be greater than that of the bank.

The flexible display device according to embodiments herein may further include a second structure disposed in the third region defined by the bank.

In the flexible display device according to embodiments herein, a cross-sectional area of the second structure may become larger toward the substrate, that is, be inversely tapered toward the substrate.

In the flexible display device according to embodiments herein, a thickness of the second structure may be smaller than 3 μm.

In the flexible display device according to embodiments herein, a separation distance between the first and second structures may be 5 μm or less.

A method for manufacturing a flexible display device according to embodiments herein can include a step of disposing an intermediate layer to cover a thin film transistor over a substrate over which the thin film transistor is disposed, a step of disposing a first electrode electrically connected to the thin film transistor on the intermediate layer, a step of disposing on the intermediate layer a first structure to be spaced apart from the first electrode and tapered to the substrate, a step of disposing a bank on the intermediate layer and the first electrode, a step of disposing an organic light emitting layer on the first electrode, and a step of disposing a second electrode to overlap with all or at least a part of the substrate on the organic light emitting layer.

Features, structures, effects, and the like described in the examples and embodiments herein are included in at least one example or embodiment of the present disclosure, and are not necessarily limited to only one example or embodiment. Furthermore, the features, structures, effects, etc. described in at least one example or embodiment of the present disclosure may be combined or modified for other examples by a person having ordinary skill in the art to which the present disclosure belongs. Accordingly, contents related to such combinations and modifications should be construed as being included in the scope of the present disclosure.

The present disclosure described above is not limited to the embodiments described above and accompanying drawings, but may be implemented in various different forms. Various modifications, additions and substitutions to the described embodiments will be readily apparent to those skilled in the art, and the general principles defined herein may be applied to other embodiments and applications without departing from the spirit and scope of the present invention. The scope of protection of the present disclosure should be construed based on the following claims, and all technical ideas within the scope of equivalents thereof should be construed as being included within the scope of the present disclosure. In addition, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
    a substrate;
    two first sub-pixels over the substrate and are in a same row of sub-pixels that is disposed along a first direction in a plan view of the display device, one second sub-pixel over the substrate and in a column of sub-pixels that is disposed along a second direction that is different from the first direction in the plan view, one third sub- pixel over the substrate and in the column of sub-pixels that includes the one second sub-pixel;
    a first structure over the substrate and in the column of sub-pixels that includes the one second sub-pixel and the one third sub-pixel; and
    four second structures among a plurality of second structures, arranged in four directions around each of the two first sub-pixels, the one second sub-pixel, and the one third sub-pixel,
    wherein the first structure is disposed at a center of the two first sub-pixels, the one second sub-pixel, and the one third sub-pixel in the plan view,
    wherein the two first sub-pixels are disposed symmetrically with respect to the first structure in the plan view,
    wherein the one second sub-pixel is disposed to face the one third sub-pixel in the column of sub-pixels with the first structure interposed between the one second sub-pixel and the one third sub-pixel such that the one second sub-pixel and the one third sub-pixel overlap the first structure in the second direction in the plan view.

2. The display device according to claim 1, wherein the first structure has a tapered shape whose dimensions increase as a distance from the substrate decreases.

3. The display device according to claim 1,
    wherein the plurality of second structures have an inversely tapered shape whose dimensions decrease as a distance from the substrate decreases.

4. The display device according to claim 3, wherein at least one of the plurality of second structures is disposed between two adjacent subpixels among the two first sub-pixels, the one second sub-pixel, and the one third sub-pixel in the plan view.

5. The display device according to claim 3, wherein the plurality of second structures are separated from the first structure.

6. The display device according to claim 5, wherein a separation distance between the first structure and any one of the plurality of second structures is 5 μm or less.

7. The display device according to claim 1, further comprising:
    a thin film transistor disposed over the substrate;
    an intermediate layer disposed to cover the thin film transistor;
    a first electrode located on the intermediate layer and connected to the thin film transistor, wherein the first electrode is included in one of the two first sub-pixels, the one second sub-pixel, and the one third sub-pixel; and
    a bank located on the intermediate layer and the first electrode, and defining a first region exposing a part of the intermediate layer, a second region exposing a part of the first electrode, and a third region excluding the first and second regions,
    wherein the first structure is disposed on the third region of the bank.

8. The display device according to claim 7, further comprising a second structure located in the first region,
    wherein the second structure is surrounded by the bank and contacts the bank.

9. The display device according to claim 8, wherein the second structure has an inversely tapered shape whose dimensions decrease as a distance from the substrate decreases.

10. The display device according to claim 8, wherein a thickness of the second structure is greater than a thickness of the bank.

11. The display device according to claim 7, further comprising:
    an organic light emitting layer disposed on the first electrode exposed in the second region; and
    a second electrode disposed on the organic light emitting layer,
    wherein the organic light emitting layer and the second electrode are included in one of the two first sub-pixels, the one second sub-pixel, and the one third sub-pixel, and
    wherein the organic light emitting layer has an access hole exposing a part of the bank in a vicinity of the first region.

12. The display device according to claim 11, further comprising an encapsulation layer disposed on the second electrode.

13. The display device according to claim 1, wherein a thickness of the first structure is less than 3um.

14. The display device according to claim 1, wherein a second structure among the plurality of second structures, extending from the first structure into a region between two adjacent subpixels among the two first sub-pixels, the one second sub-pixel, and the one third sub-pixel to block the two adjacent subpixels.

* * * * *